(12) United States Patent
Lee et al.

(10) Patent No.: US 9,508,948 B2
(45) Date of Patent: Nov. 29, 2016

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Se Hee Lee, Gyeonggi-do (KR); Seok Jong Lee, Gyeonggi-do (KR); Sun Kap Kwon, Gyeonggi-do (KR); Ho Sung Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/107,050

(22) Filed: Dec. 16, 2013

(65) Prior Publication Data

US 2014/0183482 A1 Jul. 3, 2014

(30) Foreign Application Priority Data

Dec. 27, 2012 (KR) ........................ 10-2012-0154819

(51) Int. Cl.
*H01L 51/05* (2006.01)
*B82Y 10/00* (2011.01)
(Continued)

(52) U.S. Cl.
CPC ......... *H01L 51/5064* (2013.01); *H01L 51/508* (2013.01); *H01L 51/5278* (2013.01)

(58) Field of Classification Search
CPC ............ H01L 51/0545; H01L 51/0036; H01L 51/0541; H01L 51/5012; H01L 27/1214; H01L 51/56; B82Y 10/00; B82Y 30/00; Y02E 10/50
USPC ....................................... 257/40; 438/82, 99
See application file for complete search history.

(56) References Cited

U.S. PATENT DOCUMENTS

2006/0008740 A1* 1/2006 Kido et al. .................... 430/296
2008/0265759 A1 10/2008 Young et al.
(Continued)

FOREIGN PATENT DOCUMENTS

CN 101308863 A 11/2008
CN 102163615 A 8/2011
(Continued)

OTHER PUBLICATIONS

First Notification of Office Action dated Mar. 1, 2016, from The State Intellectual Property Office of China in counterpart Chinese patent application No. 201310684581.0.
(Continued)

*Primary Examiner* — John C Ingham
*Assistant Examiner* — Didarul Mazumder
(74) *Attorney, Agent, or Firm* — Morgan, Lewis & Bockius LLP

(57) ABSTRACT

Disclosed is an organic light emitting display device. The organic light emitting display device includes a substrate in which at least three pixel areas are defined, a first electrode and a hole transporting layer formed on the substrate, an light-emitting material layer formed on the hole transporting layer in each of the pixel areas, and an electron transporting layer and a second electrode formed on the light-emitting material layer. An optical assistant transporting layer is formed on the light-emitting material layer at a position corresponding to one of the pixel areas, and formed of an electron transporting material. Accordingly, provided can be a high-resolution organic light emitting display device that solves an imbalance of electric charges and has an excellent light output efficiency and an enhanced service life.

15 Claims, 7 Drawing Sheets

(51) Int. Cl.
*H01L 51/50* (2006.01)
*H01L 51/00* (2006.01)
*B82Y 30/00* (2011.01)
*H01L 51/52* (2006.01)

(56) References Cited

U.S. PATENT DOCUMENTS

| | | | |
|---|---|---|---|
| 2008/0284324 A1 | 11/2008 | Chun et al. | |
| 2010/0187552 A1* | 7/2010 | Lee et al. | 257/98 |
| 2011/0133227 A1* | 6/2011 | Lee et al. | 257/89 |
| 2011/0140090 A1* | 6/2011 | Jeong et al. | 257/40 |
| 2011/0180825 A1 | 7/2011 | Lee et al. | |
| 2011/0193130 A1* | 8/2011 | Naijo | 257/100 |
| 2012/0104422 A1* | 5/2012 | Lee et al. | 257/88 |
| 2012/0298968 A1* | 11/2012 | Kim et al. | 257/40 |
| 2012/0299037 A1* | 11/2012 | Lee | H01L 51/5206 257/98 |
| 2012/0326132 A1* | 12/2012 | Ko et al. | 257/40 |
| 2013/0001531 A1* | 1/2013 | Park et al. | 257/40 |
| 2013/0001532 A1* | 1/2013 | Hwang et al. | 257/40 |
| 2013/0026475 A1* | 1/2013 | Choi | H01L 27/3265 257/59 |
| 2013/0048986 A1* | 2/2013 | Lee | H01L 51/5265 257/52 |
| 2013/0228754 A1* | 9/2013 | Park | 257/40 |

FOREIGN PATENT DOCUMENTS

| | | |
|---|---|---|
| CN | 102800812 A | 11/2012 |
| TW | 201249255 A | 12/2012 |
| TW | I470848 B | 1/2015 |

OTHER PUBLICATIONS

Examination Statement dated Oct. 26, 2015 from the Taiwan Advance Patent & Trade Office in counterpart Taiwanese patent application No. 102145704.

* cited by examiner

ORGANIC LIGHT EMITTING DISPLAY DEVICE AND METHOD OF MANUFACTURING THE SAME

CROSS-REFERENCE TO RELATED APPLICATIONS

This application claims the benefit of the Korean Patent Application No. 10-2012-0154819 filed on Dec. 27, 2012, which is hereby incorporated by reference as if fully set forth herein.

BACKGROUND

1. Field of the Invention

The present invention relates to an organic light emitting display device and a method of manufacturing the same.

2. Discussion of the Related Art

As a type of new flat panel display device, organic light emitting display devices are self-illumination display devices, and have a better viewing angle and contrast ratio than liquid crystal display (LCD) devices. Also, since the organic light emitting display devices do not need a separate backlight, it is possible to lighten and thin the organic light emitting display devices, and the organic light emitting display devices have excellent power consumption compared to LCD devices and the other flat panel display devices. Furthermore, the organic light emitting display devices are driven with a low direct current (DC) voltage, have a fast response time, and are low in manufacturing cost.

In organic light emitting display devices, an electron and a hole are respectively injected from a cathode and an anode into an light-emitting material layer, and, when an exciton in which the injected electron and hole are combined is shifted from an excited state to a base state, light is emitted. In this case, the types of organic light emitting display devices are categorized into a top emission type, a bottom emission type, and a dual emission type according to an emission direction of light, and categorized into a passive matrix type and an active matrix type according to a driving type.

Specifically, the organic light emitting display devices includes a first electrode (anode), a hole transporting layer, an light-emitting material layer including a red organic emission pattern, a green organic emission pattern, or a blue organic emission pattern, an electron transporting layer, and a second electrode (cathode), which are formed in each of a red pixel area (P1), a green pixel area (P2), and a blue pixel area (P3).

In the organic light emitting display devices having the configuration, when a voltage is applied to the first and second electrodes, a hole moves to the light-emitting material layer through the hole transporting layer, an electron moves to the light-emitting material layer through the electron transporting layer, and the hole and the electron are combined in the light-emitting material layer, thereby emitting light. In this case, the pixel areas have different wavelengths of light, and thus, an optical distance should be adjusted for adjusting a desired color purity and intensity. Generally, the hole transporting layers in the respective pixel areas are formed to have different thicknesses, and adjusting the thickness of the hole transporting layers affects a mobility characteristic of a hole.

However, when the mobility characteristic of a hole is degraded, an electric charge imbalance of the light-emitting material layer occurs, and consequently affects a light output efficiency and service life characteristic of a device.

For this reason, various methods of manufacturing an organic light emitting display device are being required for enhancing a light output efficiency and a service life in consideration of the mobility characteristic of a hole.

SUMMARY

Accordingly, the present invention is directed to provide an organic light emitting display device and a method of manufacturing the same that substantially obviate one or more problems due to limitations and disadvantages of the related art.

An aspect of the present invention is directed to provide a high-resolution organic light emitting display device that solves an imbalance of electric charges and has an excellent light output efficiency and an enhanced service life.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including: a substrate in which at least three pixel areas are defined; a first electrode and a hole transporting layer formed on the substrate; an light-emitting material layer formed on the hole transporting layer in each of the pixel areas; and an electron transporting layer and a second electrode formed on the light-emitting material layer, an optical assistant transporting layer is formed on the light-emitting material layer at a position corresponding to one of the pixel areas, and formed of an electron transporting material.

In another aspect of the present invention, there is provided a method of manufacturing an organic light emitting display device, including: forming a first electrode all over a substrate in which at least three pixel areas are defined; forming a hole transporting layer on the first electrode; forming a first optical assistant transporting layer on the hole transporting layer at a position corresponding to a first pixel area; forming a first light-emitting material layer on the first optical assistant transporting layer, forming a second light-emitting material layer on the hole transporting layer at a position corresponding to a second pixel area, and forming a third light-emitting material layer on the hole transporting layer at a position corresponding to a third pixel area; forming a second optical assistant transporting layer on the second light-emitting material layer; forming an electron transporting layer on the first light-emitting material layer, the second optical assistant transporting layer, and the third light-emitting material layer; and forming a second electrode on the electron transporting layer.

In another aspect of the present invention, there is provided a method of manufacturing an organic light emitting display device, including: forming a first electrode all over a substrate in which at least three pixel areas are defined; forming a hole transporting layer on the first electrode; forming a second optical assistant transporting layer on the hole transporting layer at a position corresponding to a second pixel area; forming a first light-emitting material layer on the hole transporting layer at a position corresponding to a first pixel area, forming a third light-emitting material layer on the hole transporting layer at a position corresponding to a third pixel area, and forming a second light-emitting material layer on the second optical assistant transporting layer; forming a first optical assistant transporting layer on the first light-emitting material layer; forming an electron transporting layer on the first optical assistant transporting layer, the second light-emitting material layer, and the third light-emitting material layer; and forming a second electrode on the electron transporting layer.

In another aspect of the present invention, there is provided a method of manufacturing an organic light emitting display device, including: forming a first electrode all over a substrate in which at least three pixel areas are defined; forming a hole transporting layer on the first electrode; forming first to third light-emitting material layers on the hole transporting layer at respective positions corresponding to first to third pixel areas; forming a first optical assistant transporting layer on the first light-emitting material layer at a position corresponding to the first pixel area; forming a second optical assistant transporting layer on the second light-emitting material layer at a position corresponding to the second pixel area; forming an electron transporting layer on the first optical assistant transporting layer, the second optical assistant transporting layer, and the third light-emitting material layer; and forming a second electrode on the electron transporting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
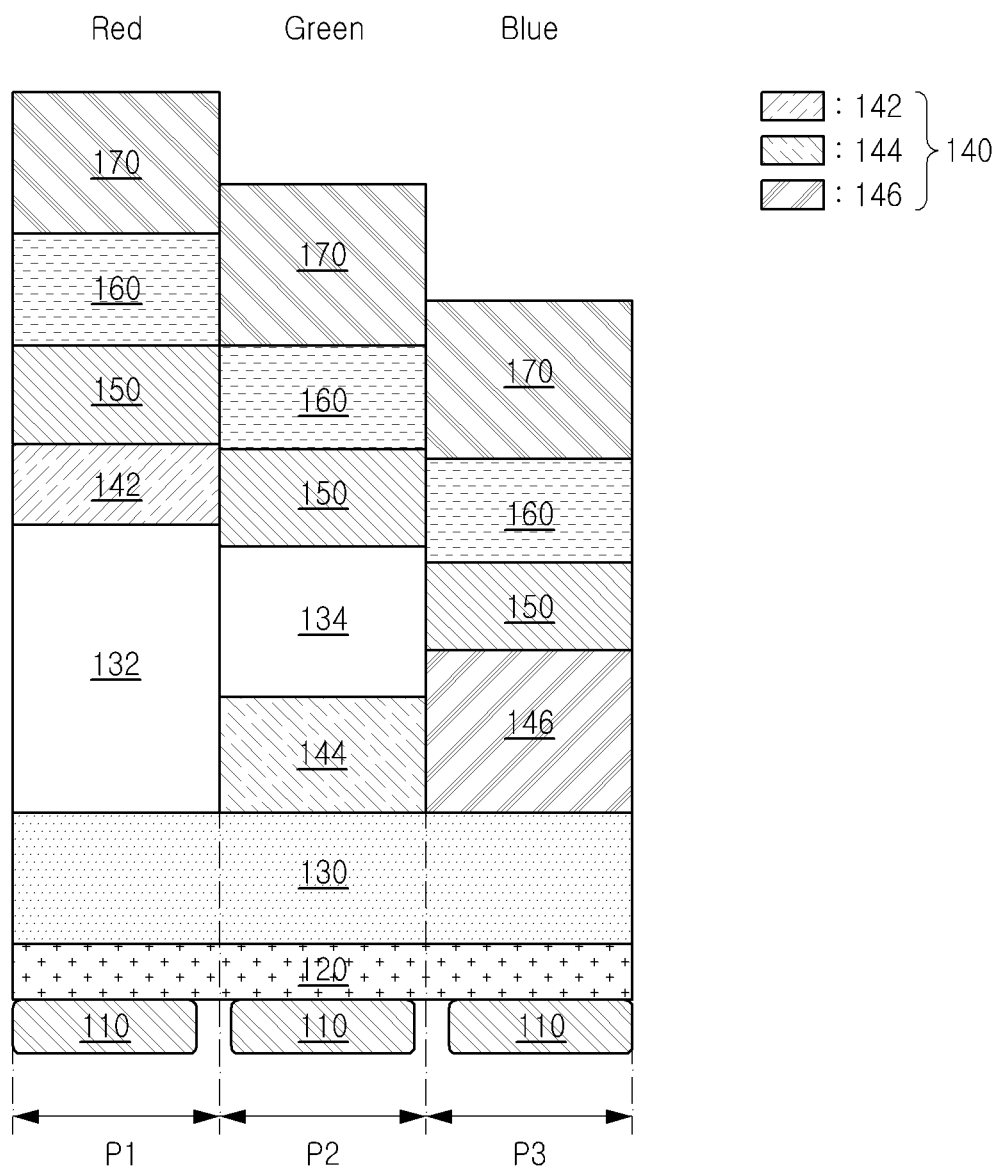
FIG. 1 is a cross-sectional view schematically illustrating an organic light emitting display device according to an embodiment of the present invention.

Hereinafter, embodiments of the present invention will be described in detail with reference to the accompanying drawings. Like reference numerals refer to like elements throughout. In the following description, when the detailed description of the relevant known function or configuration is determined to unnecessarily obscure the important point of the present invention, the detailed description is not provided.

FIG. 1 is a cross-sectional view schematically illustrating an organic light emitting display device according to an embodiment of the present invention.

As illustrated in FIG. 1, the organic light emitting display device includes a first electrode (anode) 110, a hole injection layer 120, a hole transporting layer 130, a plurality of optical assistant transporting layers 132 and 134, an light-emitting material layer 140, an electron transporting layer 150, a second electrode (cathode) 160, and a capping layer 170 which are sequentially stacked on a substrate (not shown) in which a plurality of pixel areas, e.g., P1 to P3 are defined. Here, the light-emitting material layer 140 includes a first light-emitting material layer 142, a second light-emitting material layer 144, and a third light-emitting material layer 146.

The present invention is characterized in that another optical assistant transporting layer (e.g., optical assistant transporting layer 134) of the same kind as the optical assistant transporting layer (e.g., optical assistant transporting layer 132) disposed between the hole transporting layer and the light-emitting material layer is disposed between the emitting material layer and the electron transporting layer, and formed of an electron transporting material.

Although not shown, in the organic light emitting display device, a plurality of gate lines and a plurality of data lines, which define a plurality of pixel areas (e.g., P1 to P3) at intersections therebetween, and a plurality of power lines that are extended in parallel to respective corresponding lines among the gate lines and the data lines are disposed on the substrate (not shown). A switching thin film transistor (TFT) connected to a corresponding gate line and data line and a driving TFT connected to the switching TFT are disposed in each of the pixel areas P1 to P3. Here, the driving TFT is connected to the first electrode 110.

In an embodiment, the organic light emitting display device includes an organic layer between the first electrode 110 and the second electrode 160 facing the first electrode 110, and the organic layer includes the hole injection layer 120, the hole transporting layer 130, a first optical assistant transporting layer 132, a second optical assistant transporting layer 134, the light-emitting material layer 140 (including the first light-emitting material layer 142, the second light-emitting material layer 144, and the third light-emitting material layer 146), and the electron transporting layer 150. Here, the first light-emitting material layer 142 may be formed of an organic material capable of emitting red light, the second light-emitting material layer 144 may be formed of an organic material capable of emitting green light, and the third light-emitting material layer 146 may be formed of an organic material capable of emitting blue light.

The first electrode 110 is formed in a plate shape in each of the red, green, blue, and white pixel areas and on the substrate (not shown). The first electrode 110 is a reflective electrode, and for example, may have a multi-layer structure that includes a transparent conductive material layer (having a high work function) such as indium tin oxide (ITO) and a reflective material layer such as Ag or a silver (Ag) alloy.

The hole injection layer 120 and the hole transporting layer 130 are formed on the first electrode 110 and in respective positions corresponding to the pixel areas P1 to P3. The hole transporting layer 130 may be called a common layer, and the hole injection layer 120 may not be provided. A thickness of the hole injection layer 120 and hole transporting layer 130 may be about 100 to 1,200 Å, but may be adjusted in consideration of a hole injection characteristic and a hole transport characteristic.

The hole transporting layer 130 easily transfer a hole to the light-emitting material layer, and moreover allows an electron (generated from the cathode electrode) to be transferred to only an light-emission area of the light-emitting material layer, thus enhancing an light-emission efficiency. That is, the hole transporting layer 130 enables a hole to be smoothly transported, and may be formed of N,N-dinaphthyl-N,N'-diphenyl benzidine (NPD), N,N'-bis-(3-methylphenyl)-N,N'-bis-(phenyl)-benzidine (TPD), 4-(9H-carbazol-9-yl)-N,N-bis[4-(9H-carbazol-9-yl)phenyl]-benzenamine (TCTA), 4,4'-N,N'-dicarbazole-biphenyl (CBP), s-TAD, or 4,4',4"-Tris(N-3-methylphenyl-N-phenyl-amino)-triphenylamine (MTDATA), but the spirit and scope of the present invention are not limited thereto.

The optical assistant transporting layer includes the first optical assistant transporting layer 132 and the second optical assistant transporting layer 134, and may further include a third optical assistant transporting layer 136.

In this case, the optical assistant transporting layer may be formed on the second light-emitting material layer 144 at a position corresponding to the green pixel area P2. That is, according to the present invention, at least one of the first to third optical assistant transporting layers 132, 134 and 136 may be formed on an light-emitting material layer at a position corresponding to at least one pixel areas. Here, when the optical assistant transporting layer is disposed between the light-emitting material layer and the electron transporting layer depending on each of the pixel areas, the optical assistant transporting layer is not provided between the hole transporting layer and the light-emitting material layer. That is, this denotes that the optical assistant transporting layer performs an electron transporting function instead of a hole transporting function, and adjusts an optical distance not between the light-emitting material layer and the hole transporting layer but between the light-emitting material layer and the electron transporting layer.

Each of the first and second optical assistant transporting layers 132 and 134 may have a thickness of about 100 to 1100 Å. Here, the thickness of the second optical assistant transporting layer 134 may be formed less than that of the first optical assistant transporting layer 132, but the spirit and scope of the present invention are not limited thereto.

The first and second optical assistant transporting layers 132 and 134 may be formed of the same material as that of the electron transporting layer 150. Specifically, the first and second optical assistant transporting layers 132 and 134 may include one or more selected from among tris(8-hydroxyquinolino)aluminum (Alq3), PBD, TAZ, spiro-PBD, BAlq, and SAlq. Also, the first and second optical assistant transporting layers 132 and 134 may be formed of singly the same material as that of a host of the light-emitting material layer 140, an anthracene derivative, or an oxadiazole derivative, or formed in combination with LiQ.

The light-emitting material layer 140 includes the first light-emitting material layer 142, the second light-emitting material layer 144, and the third light-emitting material layer 146 that are formed at respective positions corresponding to the first to third pixel areas P1 to P3. That is, the first light-emitting material layer 142 is formed at a position corresponding to the first pixel area P1, the second light-emitting material layer 144 is formed at a position corresponding to the second pixel area P2, and the third light-emitting material layer 146 is formed at a position corresponding to the third pixel area P3. A thickness of each of the first to third light-emitting material layers 142, 144 and 146 may be about 100 to 400 Å, but adjusted in consideration of a light-emission characteristic.

The light-emitting material layer 140 includes a host and a dopant. In addition, the light-emitting material layer 140 may include a material which emit red, green, blue, or white light, and may be formed of a phosphorescent or fluorescent material.

Here, when the light-emitting material layer 140 emits red light, the light-emitting material layer includes a host material including carbazole biphenyl (CBP) or 1,3-bis(carbazol-9-yl) (mCP), and the host material may be a phosphorescent material including a dopant which includes one or more selected from PIQIr(acac)(bis(1-phenylisoquinoline)acetylaetonate iridium, PQIr(acac)(bis(1-phenylquinoline)acetylacetonate iridium), PQIr(tris(1-phenylquinoline)iridium), or otherwise PtOEP(octaethylporphyrin platinum) and a fluorescent material including PBD: $Eu(DBM)_3(Phen)$ or perylene, but is not limited thereto.

When the light-emitting material layer 140 emits green light, the light-emitting material layer includes a host material including CBP or mCP, may be a phosphorescent material including a dopant material which includes Ir(ppy)$_3$(fac tris(2-phenylpyridine)iridium), or otherwise a fluorescent material including Alq3(tris(8-hydroxyquinolino)aluminum), but is not limited thereto.

When the light-emitting material layer 140 emits blue light, the light-emitting material layer 140 includes a host material including CBP or mCP, and the host material may be a phosphorescent material including $(4,6-F_2ppy)_2Irpic$ or L2BD111.

On the other hand, the host material may be a fluorescent material including one selected from spiro-DPVBi, spiro-6P, distyryl benzene (DSB), a PFO-based polymer and a PPV-based polymer, but is not limited thereto.

The electron transporting layer 150 is formed on the light-emitting material layer or optical assistant transporting layer at a position corresponding to all of the pixel areas P1 to P3, and thus may be called the common layer. A thickness of the electron transporting layer 150 may be about 200 to 400 Å, but adjusted in consideration of an electron transporting characteristic. The electron transporting layer 150 may act as an electron transporting and injecting layer, but an electron injection layer may be separately formed on the electron transporting layer 150.

The electron transporting layer 150 may include one or more selected from among tris(8-hydroxyquinolino)aluminum (Alq3), PBD, TAZ, spiro-PBD, BAlq, and SAlq, but the spirit and scope of the present invention are not limited thereto. Also, the electron transporting layer 150 may be formed by an evaporation method or a spin coating method.

The second electrode 160 is formed on the electron transporting layer 150. For example, the second electrode 160 is formed of an alloy (Mg:Ag) of Mg and Ag, and has semi-transmissive characteristic. That is, light emitted from the light-emitting material layer 140 is transferred to the outside through the second electrode 160, in which some of the light is again transferred to the first electrode 110 because the second electrode 160 has a semi-transmissive characteristic.

Therefore, repetitive reflection is performed between the first electrode 110 (acting as a reflective electrode) and the second electrode 160. This is called the micro-cavity effect. That is, light is repeatedly reflected in a cavity between an anode (which is the first electrode 110) and a cathode that is the second electrode 160, thereby increasing light efficiency.

In this case, light respectively emitted from the first to third light-emitting material layers 142, 144 and 146 has different wavelengths, and thus, a thickness "d" of a cavity defined as a distance between the first and second electrodes 110 and 160 is differently set. That is, the thickness "d" of the green pixel area P2 is less than that of the red pixel area P1 that emits red light having the longest wavelength, and greater than that of the blue pixel area P3 that emits blue light having the shortest wavelength.

Therefore, the present invention adjusts a thickness of the optical assistant transporting layer, and thus, a distance between the first electrode 110 and the second electrode 160 is differently formed at the pixel areas P1 to P3. That is, a thickness of the second optical assistant transporting layer 134 formed at a position corresponding to the second pixel area P2 is formed less than that of the first optical assistant transporting layer 132 formed at a position corresponding to the first pixel area P1.

The capping layer 170 increases a light extraction effect and protects the organic light emitting display device against an external foreign material and oxidization. The capping layer 170 may be formed of one of a material forming the hole transporting layer 130, a material forming the electron transporting layer 150, and host materials of the red, green, and blue light-emitting material layers 142, 144 and 146, and may not be provided.

As described above, the organic light emitting display device according to an embodiment of the present invention can maintain a light output efficiency and a color characteristic, and realize a high-quality image.

Hereinafter, characteristic evaluation of the organic light emitting display device according to an embodiment of the present invention and a comparative example will be described. However, the following examples 1 to 3 merely exemplify the present invention, and the present invention is not limited to the following examples 1 to 3.

Figure 2:
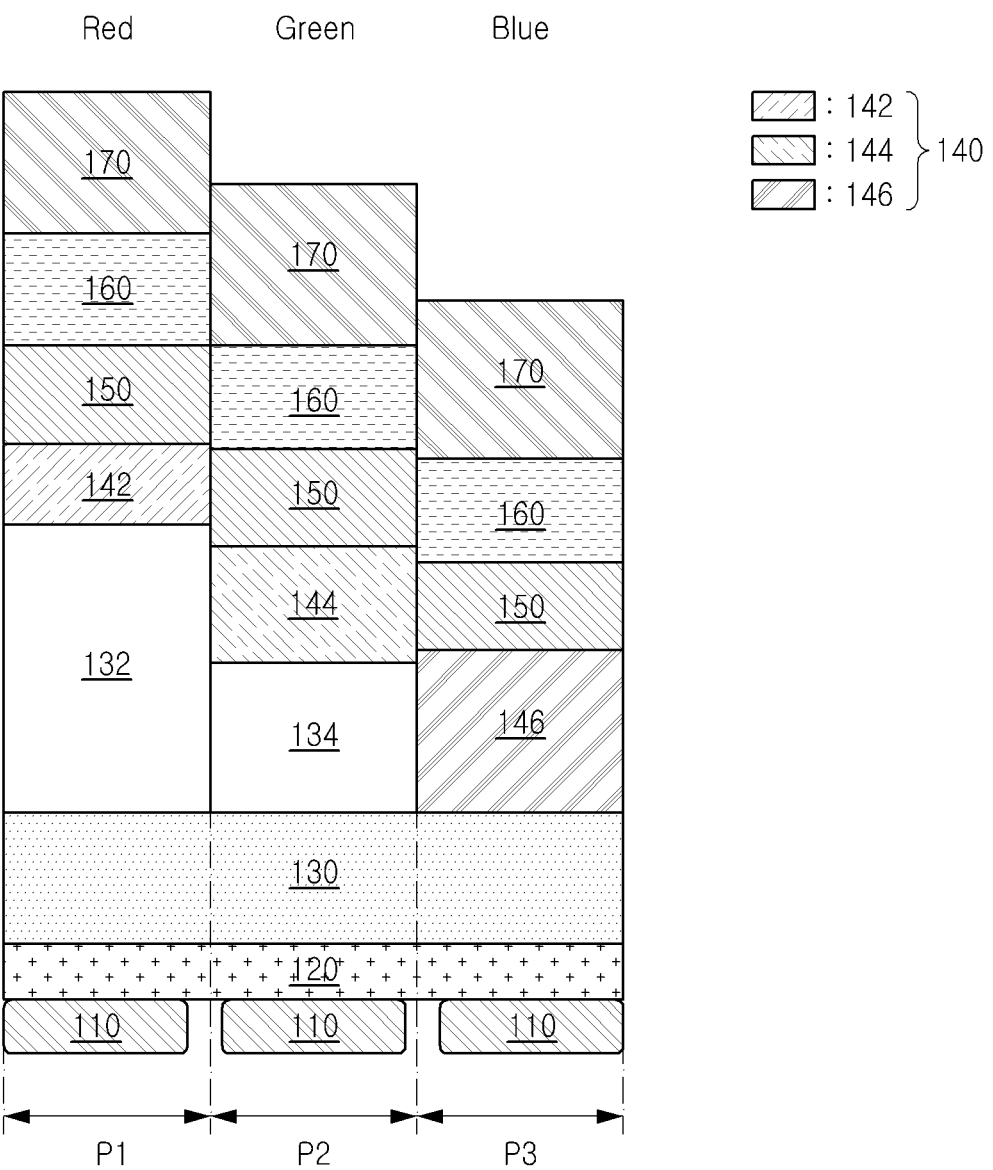
FIG. 2 is a cross-sectional view schematically illustrating a related art organic light emitting display device.
Figure 3:
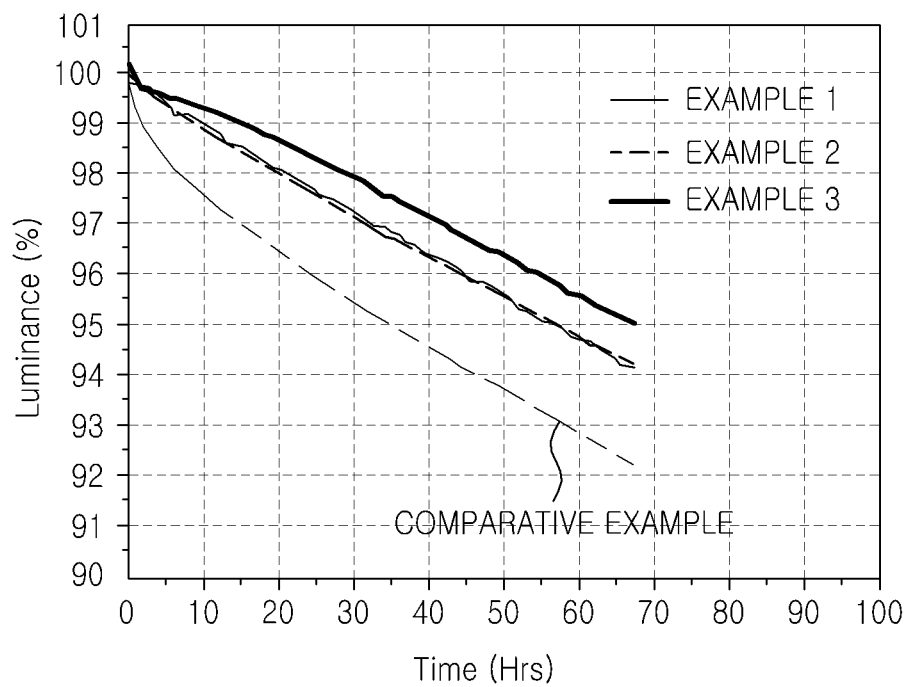
FIG. 3 is a view that compares service life characteristics of a comparative example and examples 1 to 3.

FIG. 2 is a cross-sectional view schematically illustrating a related art organic light emitting display device, and FIG. 3 is a view that compares service life characteristics of the comparative example and the examples 1 to 3.

As illustrated in FIG. 2, the comparative example relates to a related art organic light emitting display device in which the first optical assistant transporting layer 132 is formed between the hole transporting layer 130 and the first light-emitting material layer 142, and the second optical assistant transporting layer 134 is formed between the hole transporting layer 130 and the second light-emitting material layer 144.

Specifically, the related art organic light emitting display device has a top emission type, and has a structure in which an anode, a hole injection layer (HATCN, 50 Å), a hole transporting layer (NPD, 1100 Å), a first optical assistant transporting layer (NPD, 400 Å), a second optical assistant transporting layer (NPD, 850 Å), an light-emitting material layer (red, green, and blue light emitting materials), an electron transporting layer (Alq3, 360 Å), a cathode (Mg: Ag=10:1, 140 Å), and a capping layer (NPD, 6500 Å) are disposed.

On the other hand, the example 1 relates to an organic light emitting display device having the structure of FIG. 1, and has a structure in which the second optical assistant transporting layer 134 is disposed between the second light-emitting material layer 144 and the electron transporting layer 150 in the related art organic light emitting display device of the comparative example. In this case, the second optical assistant transporting layer 134 uses the same material as an electron transporting material. Also, the organic light emitting display device of the example 2 is formed to have the same structure as that of the example 1, but the second optical assistant transporting layer 134 is formed of the same material as the host of the light-emitting material layer. In addition, the organic light emitting display device of the example 3 is formed to have the same structure as that of the example 1, but the second optical assistant transporting layer 134 is formed of an oxadiazole derivative.

Therefore, as shown in FIG. 3, it can be seen that the examples 1 to 3 enhanced service life characteristic, in comparison with the comparative example.

Optionally, the organic light emitting display device having the structure of FIG. 1 further include a third optical assistant transporting layer (not shown) formed between the third light-emitting material layer 146 and the electron transporting layer 150 at the position corresponding to the third pixel area.

FIGS. 4 to 7 are views schematically illustrating organic light emitting display devices according to another embodiment of the present invention.

Figure 4:
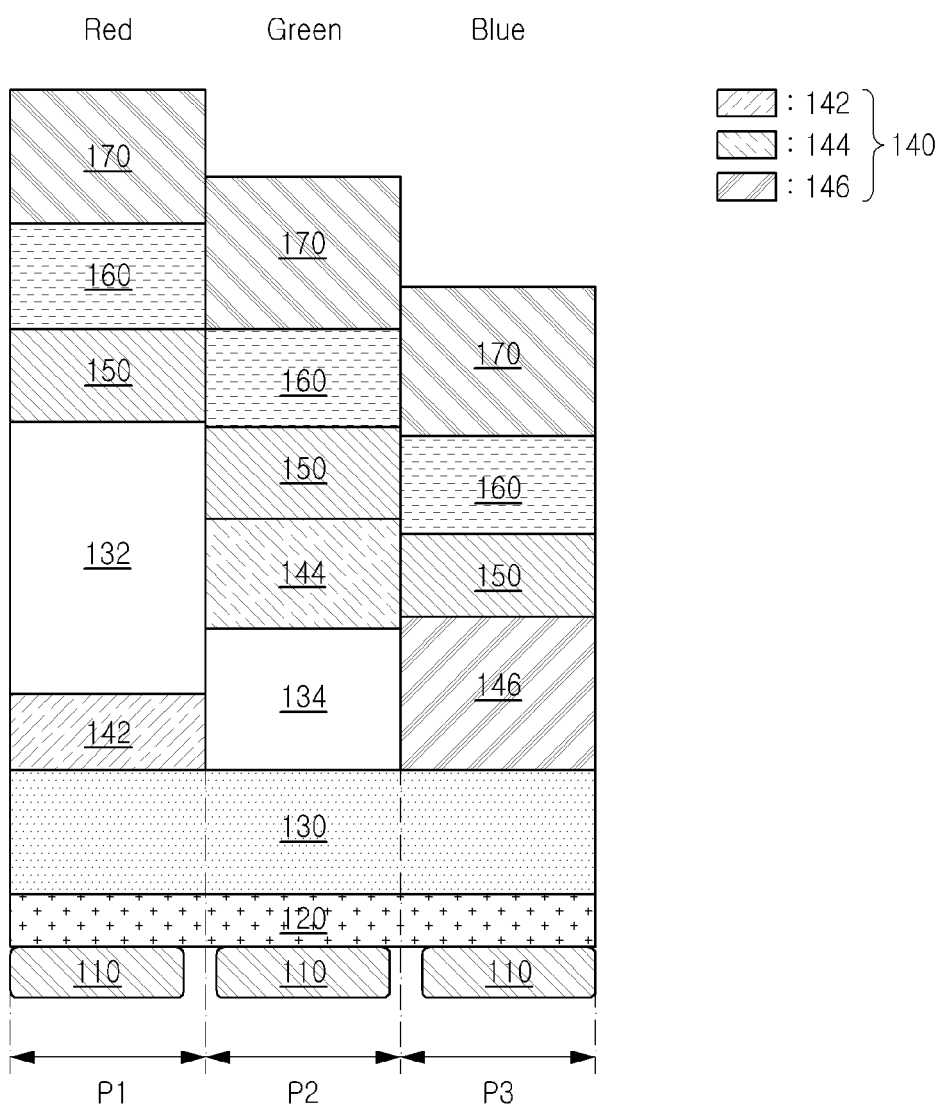
FIGS. 4 to 7 are views schematically illustrating organic light emitting display devices according to another embodiment of the present invention.

FIG. 4 illustrates a structure in which the first and second optical assistant transporting layers 132 and 134 are changed in formed position in the organic light emitting display device having the structure of FIG. 1. That is, the structure of FIG. 4 is a structure in which the first optical assistant transporting layer 132 is formed on the first light-emitting material layer 142 at a position corresponding to the red pixel area P1, and the second optical assistant transporting layer 134 is formed on the hole transporting layer 130 at a position corresponding to the green pixel area P2. Optionally, the organic light emitting display device having the structure of FIG. 4 further include a third optical assistant transporting layer (not shown) formed between the third light-emitting material layer 146 and the electron transporting layer 150 at the position corresponding to the third pixel area.

Figure 5:
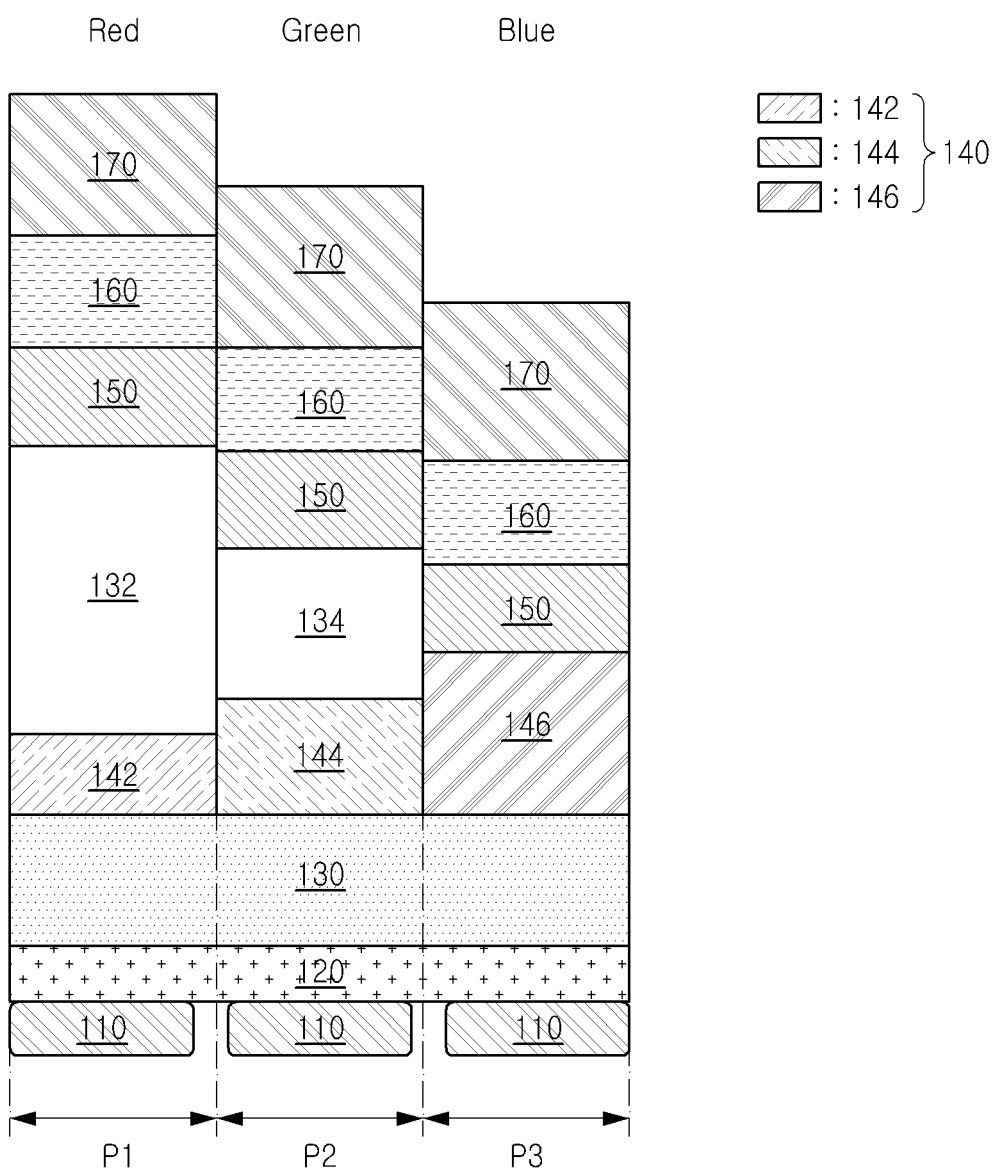

FIG. 5 illustrates a structure in which the first optical assistant transporting layer 132 is changed in formed position in the organic light emitting display device having the structure of FIG. 1. That is, the structure of FIG. 5 is a structure in which the first optical assistant transporting layer 132 is formed on the first light-emitting material layer 142 at the position corresponding to the red pixel area P1. Optionally, the organic light emitting display device having the structure of FIG. 5 further include a third optical assistant transporting layer (not shown) formed between the third light-emitting material layer 146 and the electron transporting layer 150 at the position corresponding to the third pixel area.

Figure 6:
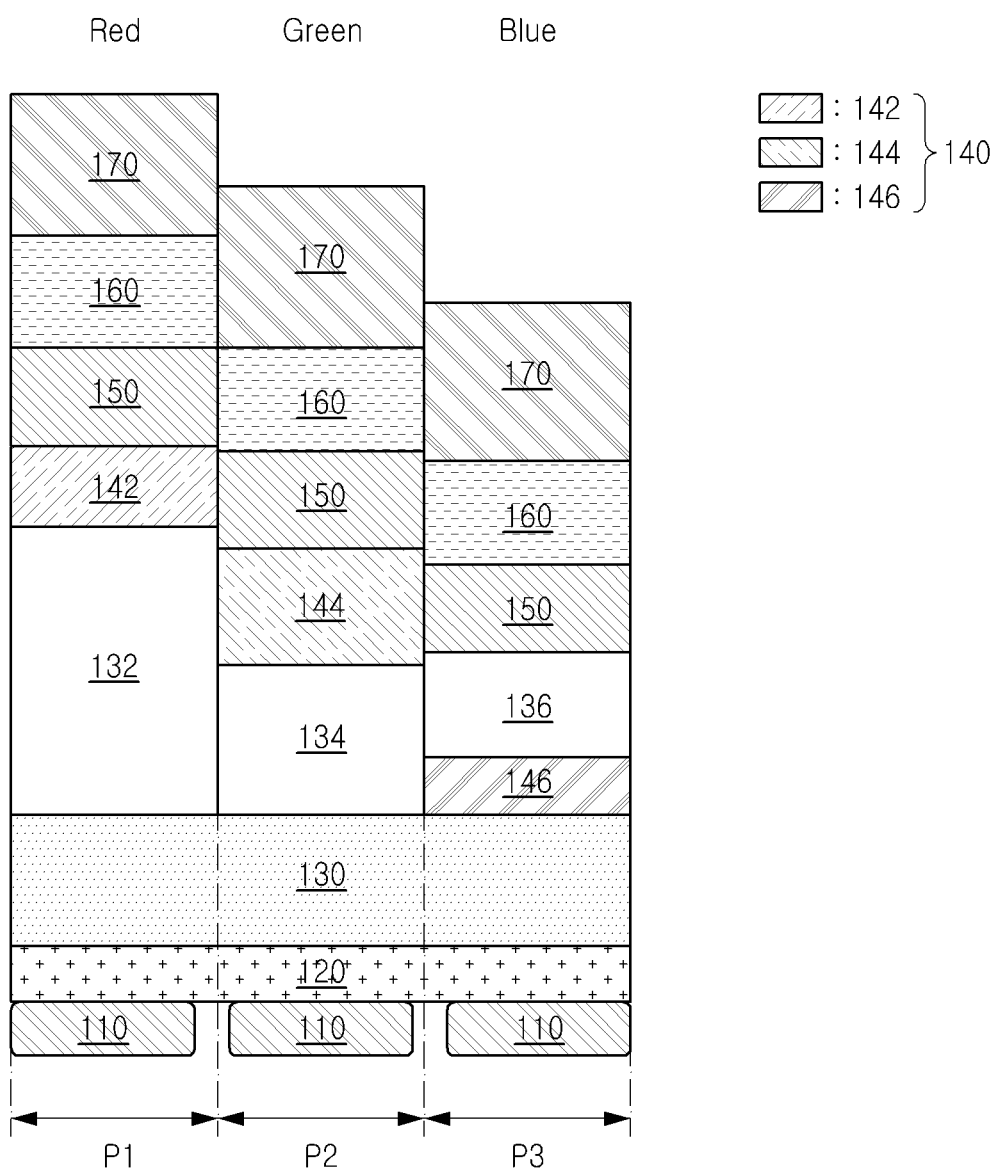

FIG. 6 illustrates a structure in which the first and second optical assistant transporting layers 132 and 134 are changed in formed position and a third optical assistant transporting layer 136 is additionally formed in the organic light emitting display device having the structure of FIG. 1. That is, the structure of FIG. 6 is a structure in which the first optical assistant transporting layer 132 is formed on the hole transporting layer 130 at the position corresponding to the red pixel area P1, the second optical assistant transporting layer 134 is formed on the hole transporting layer 130 at the position corresponding to the green pixel area P2, and the third optical assistant transporting layer 136 is formed on the third light-emitting material layer 146 at a position corresponding to the blue pixel area P3.

Figure 7:
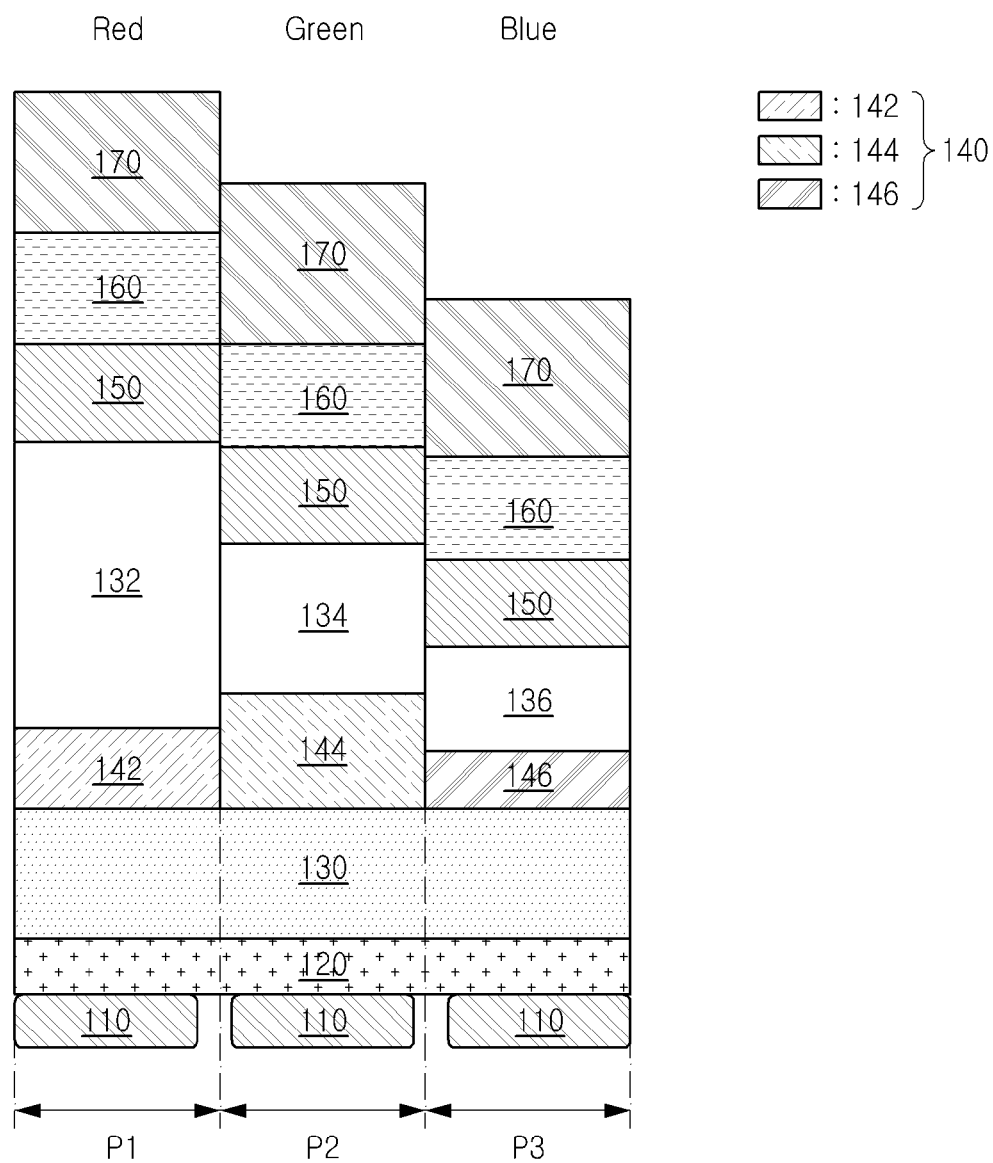

FIG. 7 illustrates a structure in which the third optical assistant transporting layer 136 is additionally formed in the organic light emitting display device having the structure of FIG. 5. That is, the structure of FIG. 7 is a structure in which the first optical assistant transporting layer 132 is formed on the first light-emitting material layer 142 at the position corresponding to the red pixel area P1, the second optical assistant transporting layer 134 is formed on the second light-emitting material layer 144 at the position corresponding to the green pixel area P2, and the third optical assistant transporting layer 136 is formed on the third light-emitting material layer 146 at the position corresponding to the blue pixel area P3.

Next, a method of manufacturing the organic light emitting display device (see FIG. 1) according to an embodiment of the present invention will be described in detail.

First, the first electrode 110 is formed on the substrate in which the first to third pixel areas P1 to P3 are defined, and then the hole injection layer 120 and the hole transporting layer 130 are formed in a first chamber without using a fine metal mask (FMM). The hole injection layer 120 may be formed by doping a P-type dopant, for example, F4-TCNQ and TCAQ, on a material of the first hole transporting layer 130, but the spirit and scope of the present invention are not limited thereto.

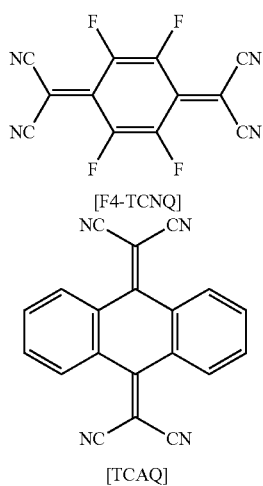

[F4-TCNQ]

[TCAQ]

Subsequently, the first optical assistant transporting layer 132 is formed on the hole transporting layer 130 at a position corresponding to the first pixel area P1 by using the FMM, and then the first to third light-emitting material layers 142, 144 and 146 are formed.

Subsequently, the second optical assistant transporting layer 134 is formed on the second light-emitting material layer 144 by using the FMM.

Finally, the electron transporting layer 150, the second electrode 160, and the capping layer 170 are sequentially formed without using the FMM.

In the specification, a top emission type organic light emitting display device (OLED) has been exemplified, but the spirit and scope of the present invention are not limited thereto. The present invention may be applied to organic light emitting display devices having various types such as a bottom emission type, a dual emission type, a tandem type, etc.

According to the present invention, the optical assistant transporting layer for adjusting an optical distance is formed between the light-emitting material layer and the electron transporting layer, and thus can adjust the optical distance and solve an electric charge imbalance of the light-emitting material layer. Also, a light output efficiency is excellent, and a service life characteristic can be enhanced.

Accordingly, the organic light emitting display device according to the present invention can realize high resolution.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a substrate in which at least three pixel areas are defined;
a first electrode formed all over the substrate;
a hole transporting layer formed on the first electrode;
a first light-emitting material layer formed on the hole transporting layer at a position corresponding to a first pixel area;
a second light-emitting material layer formed on the hole transporting layer at a position corresponding to a second pixel area;
a third light-emitting material layer formed on the hole transporting layer at a position corresponding to a third pixel area;
an electron transporting layer formed on the first light-emitting material layer, the second light-emitting material layer, and the third light-emitting material layer;
a first optical assistant transporting layer disposed between the hole transporting layer and the first light-emitting material layer;
a second optical assistant transporting layer disposed between the second light-emitting material layer and the electron transporting layer, the second light-emitting material layer disposed between and in direct contact with the second optical assistant transporting layer and the hole transporting layer; and
a second electrode formed on the electron transporting layer.

2. The organic light emitting display device of claim 1, further comprising a third optical assistant transporting layer formed between the third light emitting material layer and the hole transporting layer at the position corresponding to the third pixel area.

3. The organic light emitting display device of claim 1, wherein the second optical assistant transporting layer is formed of the same material as the electron transporting layer.

4. The organic light emitting display device of claim 2, wherein the first optical assistant transporting layer, the second optical assistant transporting layer, and the third optical assistant transporting layer are formed of the same material as a host of the light-emitting material layer.

5. The organic light emitting display device of claim 2, wherein the first optical assistant transporting layer, the second optical assistant transporting layer, and the third optical assistant transporting layer are formed of singly an anthracene derivative or an oxadiazole derivative, or formed in combination with LiQ.

6. The organic light emitting display device of claim 1, wherein the first electrode is a reflective electrode comprising a silver Ag alloy.

7. The organic light emitting display device of claim 1, wherein,
the first electrode is a reflective electrode, and
the second electrode has a semi-transmissive characteristic.

8. An organic light emitting display device comprising:
a substrate in which at least three pixel areas are defined;
a first electrode formed all over the substrate;
a hole transporting layer formed on the first electrode;
a first light-emitting material layer formed on the hole transporting layer at a position corresponding to a first pixel area;

a second light-emitting material layer formed on the hole transporting layer at a position corresponding to a second pixel area;

a third light-emitting material layer formed on the hole transporting layer at a position corresponding to a third pixel area;

an electron transporting layer formed on the first light-emitting material layer, the second light-emitting material layer, and the third light emitting material layer;

a first optical assistant transporting layer disposed below the first light-emitting material layer;

a second optical assistant transporting layer disposed above the second light-emitting material layer, the second light-emitting material layer disposed between and in direct contact with the second optical assistant transporting layer and the hole transporting layer; and a second electrode formed on the electron transporting layer.

9. The organic light emitting display device of claim 8, further comprising a hole injection layer formed between the first electrode and the hole transporting layer.

10. The organic light emitting display device of claim 8, wherein the second optical assistant transporting layer is formed of the same material as the electron transporting layer.

11. The organic light emitting display device of claim 8, wherein the first optical assistant transporting layer is formed of the same material as a host of the light-emitting material layer.

12. The organic light emitting display device of claim 1, wherein a thickness of the second optical assistant transporting layer is less than a thickness of the first optical assistant transporting layer.

13. The organic light emitting display device of claim 8, wherein a thickness of the second optical assistant transporting layer is less than a thickness of the first optical assistant transporting layer.

14. The organic light emitting display device of claim 1, wherein the first pixel area and the second pixel area each include a single light-emitting layer.

15. The organic light emitting display device of claim 8, wherein the first pixel area and the second pixel area each include a single light-emitting layer.

* * * * *